(12) United States Patent
Chua et al.

(10) Patent No.: US 6,645,885 B2
(45) Date of Patent: Nov. 11, 2003

(54) FORMING INDIUM NITRIDE (INN) AND INDIUM GALLIUM NITRIDE (INGAN) QUANTUM DOTS GROWN BY METAL-ORGANIC-VAPOR-PHASE-EPITAXY (MOCVD)

(75) Inventors: Soo Jin Chua, Singapore (SG); Peng Li, Singapore (SG); Maosheng Hao, Singapore (SG); Ji Zhang, Singapore (SG)

(73) Assignees: The National University of Singapore, Singapore (SG); Institute of Materials Research & Engineering, Singapore (SG)

( * ) Notice: Subject to any disclaimer, the term of this patent is extended or adjusted under 35 U.S.C. 154(b) by 0 days.

(21) Appl. No.: 09/963,616

(22) Filed: Sep. 27, 2001

(65) Prior Publication Data

US 2003/0059971 A1 Mar. 27, 2003

(51) Int. Cl.⁷ .............................................. H01L 21/00
(52) U.S. Cl. ..................... 438/962; 438/22; 438/46; 438/47; 438/60; 438/65; 257/10; 257/12; 257/183; 257/189; 257/200; 257/201
(58) Field of Search .............................. 438/22, 46, 47, 438/60, 65, 962; 257/183, 189, 200, 201, 10, 12

(56) References Cited

U.S. PATENT DOCUMENTS

| | | | |
|---|---|---|---|
| 5,290,393 A | * 3/1994 | Nakamura | 438/509 |
| 5,523,589 A | * 6/1996 | Edmond et al. | 257/77 |
| 5,578,839 A | * 11/1996 | Nakamura et al. | 257/96 |
| 5,684,309 A | 11/1997 | McIntosh et al. | |
| 5,851,905 A | 12/1998 | McIntosh et al. | |
| 5,880,486 A | * 3/1999 | Nakamura et al. | 257/96 |
| 5,925,897 A | 7/1999 | Oberman | |
| 5,959,307 A | * 9/1999 | Nakamura et al. | 257/14 |
| 5,970,314 A | 10/1999 | Okahisa et al. | |
| 6,078,064 A | 6/2000 | Ming-Jiunn et al. | |
| 6,285,698 B1 | * 9/2001 | Romano et al. | 372/46 |
| 6,359,292 B1 | * 3/2002 | Sugawara et al. | 257/103 |
| 6,445,009 B1 | * 9/2002 | Grandjean et al. | 438/962 |
| 6,459,096 B1 | * 10/2002 | Razeghi | 257/14 |

FOREIGN PATENT DOCUMENTS

| | | | |
|---|---|---|---|
| JP | 0801156 A2 | * 10/1997 | C30B/25/02 |
| JP | 2001308374 A | * 1/2001 | H01L/33/00 |

* cited by examiner

*Primary Examiner*—Kamand Cuneo
*Assistant Examiner*—Lisa Kilday
(74) *Attorney, Agent, or Firm*—Birch, Stewart, Kolasch & Birch, LLP

(57) ABSTRACT

Indium Nitride (InN) and Indium-rich Indium Gallium Nitride (InGaN) quantum dots embedded in single and multiple $In_xGa_{1-x}N/In_yGa_{1-y}N$ quantum wells (QWs) are formed by using TMIn and/or Triethylindium (TEIn), Ethyldimethylindium (EDMIn) as antisurfactant during MOCVD growth, wherein the photoluminescence wavelength from these dots ranges from 480 nm to 530 nm. Controlled amounts of TMIn and/or other Indium precursors are important in triggering the formation of dislocation-free QDs, as are the subsequent flows of ammonia and TMIn. This method can be readily used for the growth of the active layers of blue and green light emitting diodes (LEDs).

10 Claims, 4 Drawing Sheets

FORMING INDIUM NITRIDE (INN) AND INDIUM GALLIUM NITRIDE (INGAN) QUANTUM DOTS GROWN BY METAL-ORGANIC-VAPOR-PHASE-EPITAXY (MOCVD)

FIELD OF THE INVENTION

This invention relates to optoelectronics devices and fabrication method particularly to light emitting diodes and laser diodes.

BACKGROUND OF THE INVENTION

Light emitting diodes are widely used in optical displays, traffic lights, data storage, communications, medical and many other applications.

The development of blue LEDs and laser diodes has attracted considerable research activity to the growth of group III-nitrides. The band gap of group III-nitrides can be varied to provide light over nearly the whole spectral range from near UV to red. Accordingly, group III-nitrides find use in active regions of these devices.

The growth of $In_xGa_{1-x}N$ alloys and quantum wells is extremely difficult mostly due to the trade-off between the epilayer quality and the amount of InN incorporation into the alloy. Growth at high temperatures of approximately 800° C. typically results in high crystalline quality but the amount of InN in the solid is limited to low values because of the high volatility of indium. Lowering the growth temperature results in an increase in the indium content at the expense of reduced crystalline quality. The lattice mismatch and different thermal stability of the two constituents, InN and GaN, also complicate the growth of $In_xGa_{1-x}N$. The lattice mismatch can lead to a miscibility gap [Ho and G. B. Stringfellow, Appl. Phys. Lett. 69, 2701 (1996).], which causes fluctuations of In content across the film. Singh and co-workers[R. Singh, D. Doppalapudi, T. D. Moustakas, and L. T. Romano, Appl. Phys. Lett. 70, 1089 (1997); R. Singh and T. D. Moustakas, Mater. Res. Soc. Symp. Proc. 395, 163 (1996); R. Singh, W. D. Herzog, D. Doppalapudi, M. S. Unlu, B. B. Goldberg, and T. D. Moustakas, Mater. Res. Soc. Symp. Proc. 449, 185 (1997).] provided strong evidence of phase separation in InGaN thick films grown by molecular beam epitaxy (MBE). Other researchers reported phase separation in thick InGaN films grown by metalorganic chemical vapor deposition (MOCVD) [Akihiro Wakahara, Takashi Tokuda, Xiao-Zhong Dang, Susumu Noda, and Akio Sasaki, Appl. Phys. Lett. 71, 906, (1997); N. A. El-Masry, E. L. Piner, S. X. Liu, and S. M. Bedair Appl. Phys. Lett., 72, 40, (1998).]. Behbehani [M. K. Behbehani, E. L. Piner, S. X. Liu, N. A. El-Masry, and S. M. Bedair Appl. Phys. Lett. 75 2202, (1999)] reported the coexistence of phase-separation and ordering in $In_xGa_{1-x}N$ with x>0.25. Up to now, growth of InGaN/GaN quantum wells (QW) with emission in the green is still a challenging task.

InGaN is a very important material because it is used in the active layer of LEDs and laser diodes (LD), However, researchers have not reached consensus: on the optical emission mechanism in $In_xGa_{1-x}N/In_yGa_{1-y}N$ QWs. There are a few theories; one attributing emission to In-rich quantum dots (QDs), one attributing emission to the piezoelectric effect and another combining aspects of both. Indium-rich QDs can be formed by spinodal decomposition, Stranski-Krastanov (SK) growth mode, or using antisurfactants.

SUMMARY OF THE INVENTION

It is therefore an object of the present invention to provide an improved technique for the growth of self-organized InGaN quantum dots.

It is another object of the invention to produce light emitting diodes capable of emitting blue and green light.

These objects are provided, according to the present invention, by indium-rich QDs which are embedded in $In_xGa_{1-x}N/GaN$ or $In_xGa_{1-x}N/In_yGa_{1-y}N$ single and multiple quantum wells. These QDs are triggered by the flow of trimethyl indium (TMIn) or other indium precursors acting as antisurfactants on a non-growing surface.

The conventional method of growth of QW is the following:

First, growing a low temperature buffer and then a high temperature GaN layer, with the former usually performed in the range of 450° C. to 600° C. and the latter usually performed in the range of 900° C. to 1100° C., most typically at 1030° C. The temperature was next lowered to about 700° C. to 800° C. to grow the GaN or InGaN barrier followed by the growth of the quantum well.

In this invention, after the growth of the barrier, an appropriate amount of indium-precursor such as trimethyl indium (TMIn), or triethyl indium (TEIn) or ethyldimethyl indium (EDMIn), was flowed in the presence of ammonia. Indium atoms from indium-precursor aggregate at the atomic edges of the InGaN barriers to form the "seeds" for the subsequent growth of quantum dots. So long as these precursors are used, whether be it in MOCVD or chemical beam epitaxy (CBE), this invention is applicable.

In a preferred embodiment of the present invention, a group of $IN_xGa_{1-x}N/In_yGa_{1-y}N$ single quantum wells (SQWs) were grown by MOCVD on (0001) sapphire substrates. MOCVD was performed using trimethyl gallium (TMGa), trimethyl indium (TMIn), and ammonia ($NH_3$) as precursors, and hydrogen ($H_2$) and/or nitrogen ($N_2$) as the carrier gases. Triethyl gallium (TEGa), ethyldimethyl gallium (EDMGa), triethyl indium (TEIn), ethyldimethyl indium (EDMIn) can also be used as group III precursors, while dimethylhydrazine ($H_2N_2(CH_3)_2$. 1,1 DMHy) is preferred as a N precursor. For this group of SQWs, a 2 μm thick undoped bulk GaN was first grown on a 250 Å thick GaN buffer layer. The growth temperature was 530° C. and 1030° C. respectively for the GaN buffer and bulk layer. After deposition of the GaN bulk layer, the growth temperature was lowered down to about 700° C. to 800° C. for the deposition of the $In_xGa_{1-x}N$ barrier and the $In_yGa_{1-x}N$ well. After the deposition of the $In_xGa_{1-x}N$ barrier wherein x ranges from 0 to 0.10, and prior to the growth of $In_yGa_{1-y}N$ well, wherein y is greater than x, TMIn was flowed at a flow rate less than 100 μmol/min for a short time varying from 2 to 5 seconds with TMGa flow switched off.

The well thickness was about 30 Å. A high temperature cap layer was grown on the top of $In_xGa_{1-x}N/In_yGa_{1-y}N$ SQW at temperatures in the range of from 800° C. to 1030° C.

In the second embodiment of the present invention, the second group of SQWs was grown, the growth conditions are the same as the first except that before the growth of the InGaN barrier, a low temperature GaN layer was grown at the same temperature as the growth temperature of the barrier and well so that no temperature ramping is needed for the subsequent growth.

According to the invention, it has been found that the photoluminescence from the first and second groups of SQWs are 488 nm and 548 nm respectively at the room temperature. The luminescence from the first and the second group are in the blue and green regions respectively, which are suitable for the fabrication of blue and green LEDs.

The amount of TMIn acting as antisurfacants and the duration of the TMIn flow are important for the growth of indium-rich QDs: too small a flow may not form enough "seeds" for the subsequent growth of the QDs, while too much flow will create indium droplets which are competing with the formation of indium-rich QDs. At room temperature, the luminescence comes from these dots rather than from the wells. The quantum confinement effect of the QDs is the reason why QDs have very high efficiency of luminescence even at room temperature.

After the flowing of TMIn, which acts as antisurfactant, the subsequent flow of TMIn, TMGa and ammonia are also very important for the growth of QDs.

DETAILED DESCRIPTION OF THE INVENTION

Figure 1:
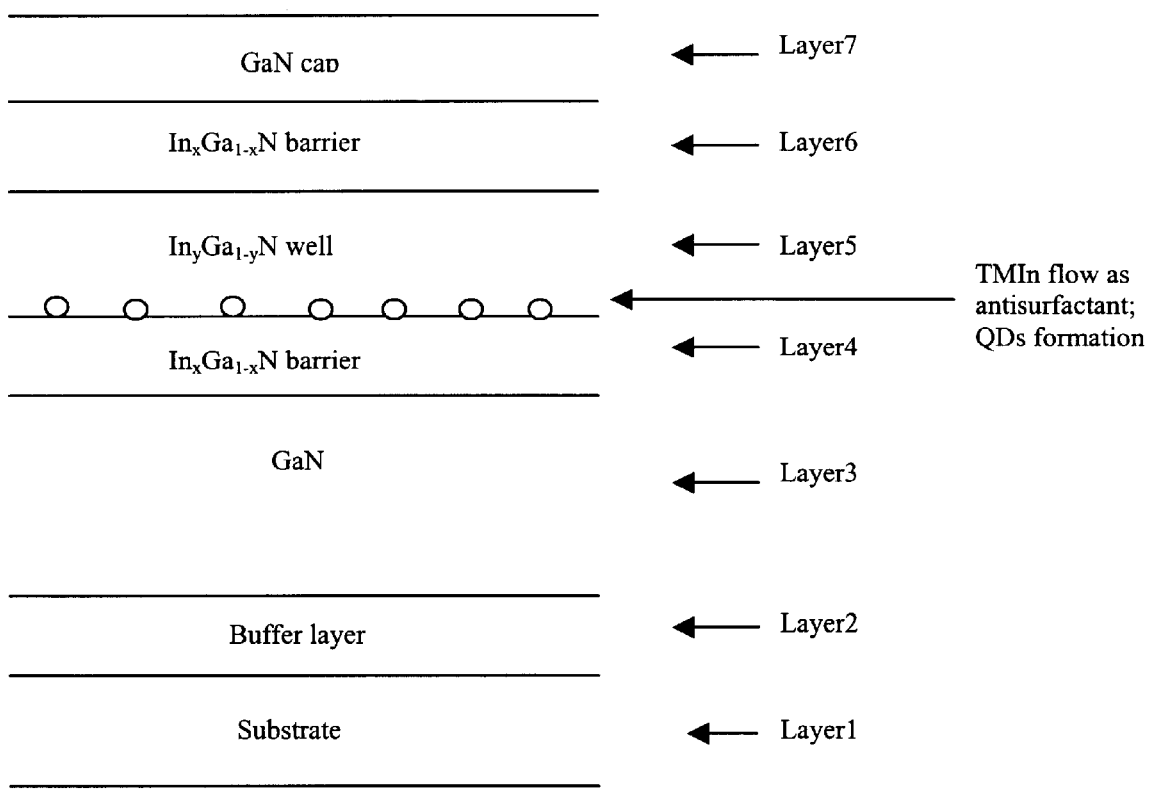
FIG. 1 illustrates the growth of SQWs in the first embodiment.

The present invention is now described more fully hereinafter with reference to the accompanying drawings, in which preferred embodiments of the inventions are shown. This invention may, however, be embodied in many different forms and should not be construed as limited to the embodiments set forth herein. Rather, the invention is defined by the following claims. In the drawings, the thicknesses of layers and regions are exaggerated for clarity.

FIG. 1 illustrates first embodiments of the InGaN/InGaN quantum well structure which can be used for the blue and green LEDs. Referring now to FIG. 1, layer 1 is the substrate which can be sapphire, silicon carbide (SiC), zinc oxide (ZnO) or other substrates. Layer 2 is the low-temperature buffer. Layer 3 is the undoped GaN or Si-doped GaN grown at around 1030° C., doped at a concentration of $2 \times 10^{17}$ cm$^{-3}$ to $9 \times 10^{18}$ cm$^{-3}$. Layer 4 is the In$_x$Ga$_{1-x}$N barrier wherein x ranges from 0 to 0.001, grown at a temperature from 700° C. to 800° C. After the growth of layer 4, TMIn and ammonia were flowed to form "seeds" for the growth of indium rich QDs at the same growth temperature of layer 4. Layer 5 is the In$_y$Ga$_{1-y}$N quantum well, wherein y is greater than x, grown at the same temperature of layer 4. Layer 6 is another In$_x$Ga$_{1-x}$N barrier grown at the same temperature of layer 4. Layer 7 is the GaN cap grown in the range of 800° C. to 1100° C. The typical thickness for each layer is 200 μm to 500 μm for layer 1, 20 nm to 40 nm for layer 2, 1 μm to 4 μm for layer 3, 2 nm to 10 nm for layer 4, 2 nm to 4 nm for layer 5, 2 nm to 10 nm for layer 6, and 10 nm to 1000 nm for layer 7.

Still continuing with the description of FIG. 1, layer 1 may be any material suitable for the growth of GaN, such as sapphire, SiC, ZnO, and other alternatives. Layer 2, the low temperature buffer, can also be a multi-layered AlGaN/GaN buffer. Layer 3 can be undoped GaN, or GaN that is Si-doped to a concentration $2 \times 10^{17}$ cm$^{-3}$ to $9 \times 10^{18}$ cm$^{-3}$, or GaN that is Mg-doped to a concentration $5 \times 10^{17}$ cm$^{-3}$ to $3 \times 10^{20}$ cm$^{-3}$. Layers 4 and 5 can be GaN and/or AlGaN instead of InGaN. Layer 7, the high temperature cap, can also be AlGaN.

Figure 2:
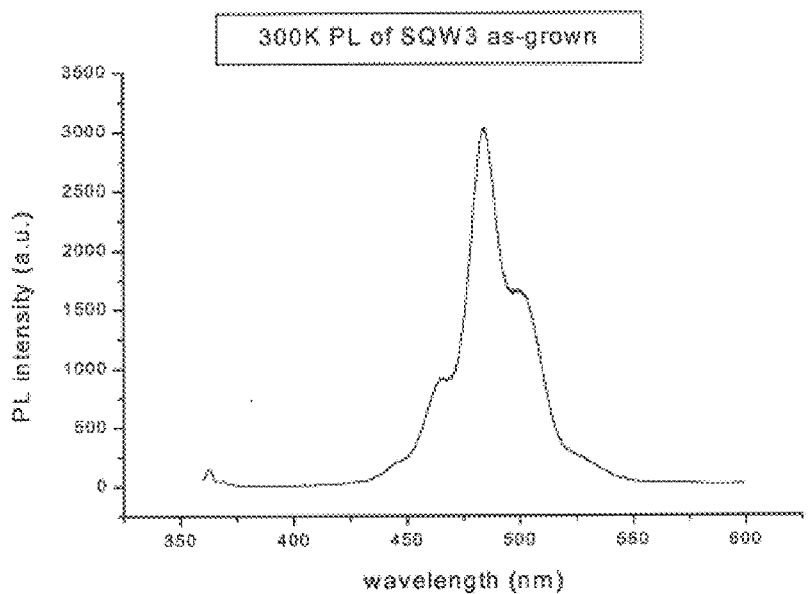
FIG. 2 is the room temperature photoluminescence from the single quantum wells of the first embodiment.

FIG. 2 shows the photoluminescence at room temperature of the first group QW in the first embodiment. The wavelength of the emission is 488 nm, which is in the blue region. Also note the narrow full width at half maxium (FWHM) of the luminescence which makes the blue color "pure" to the naked eye. This method can be readily used in the growth and fabrication of blue LEDs.

Figure 3:
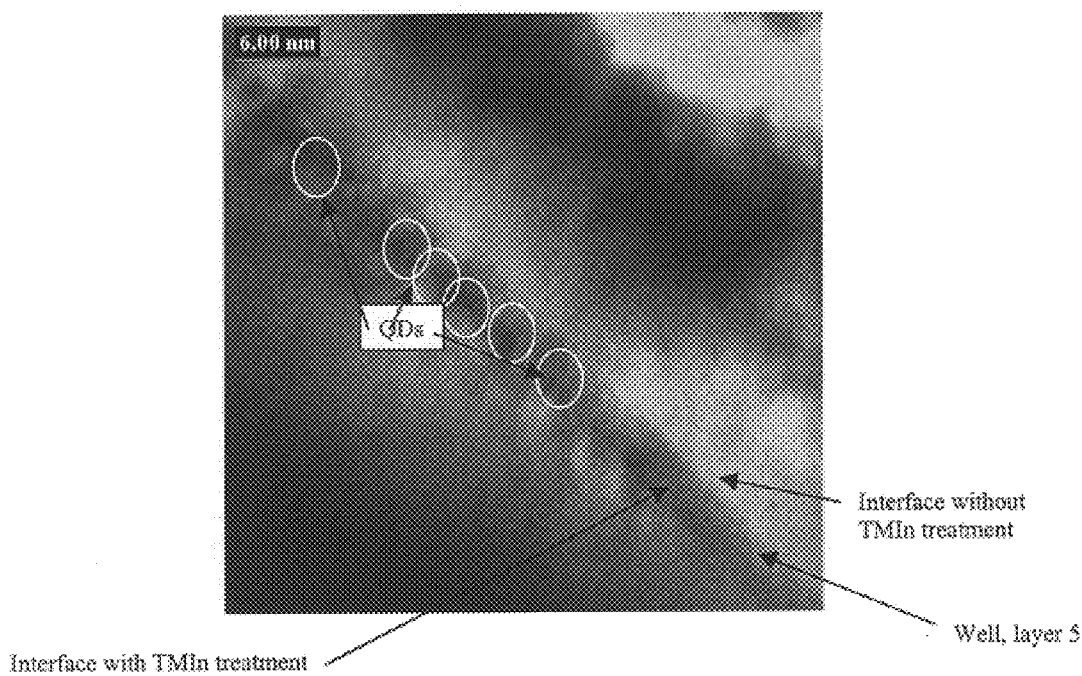
FIG. 3 is the transmission electron microscopy (TEM) of the first group of single quantum wells.

FIG. 3 shows the transmission electron microscopy (TEM) picture of the SQW in the first embodiment. As can be seen clearly from the figure, the QDs, which manifest themselves as the dark contrasts in TEM picture, are located at the interface between layer 4 (the InGaN barrier) and the layer 5 (the well). The interface between layer 4 and layer 5 is sharp. As previously mentioned, after the deposition of the InGaN barrier, flowing TMIn and ammonia provides "seeds" for the subsequent growth of these dots. The flow rate and duration of TMIn are important for the formation of these dots; a flow rate of less than 100 μmol/min and duration of 2 seconds to 5 seconds are preferred. These QDs have higher indium content than the well with typical difference of In content from 10% to 60%, and they emit light with longer wavelengths. In this case, the 488 nm luminescence comes from these QDs instead of from the well.

Figure 4:
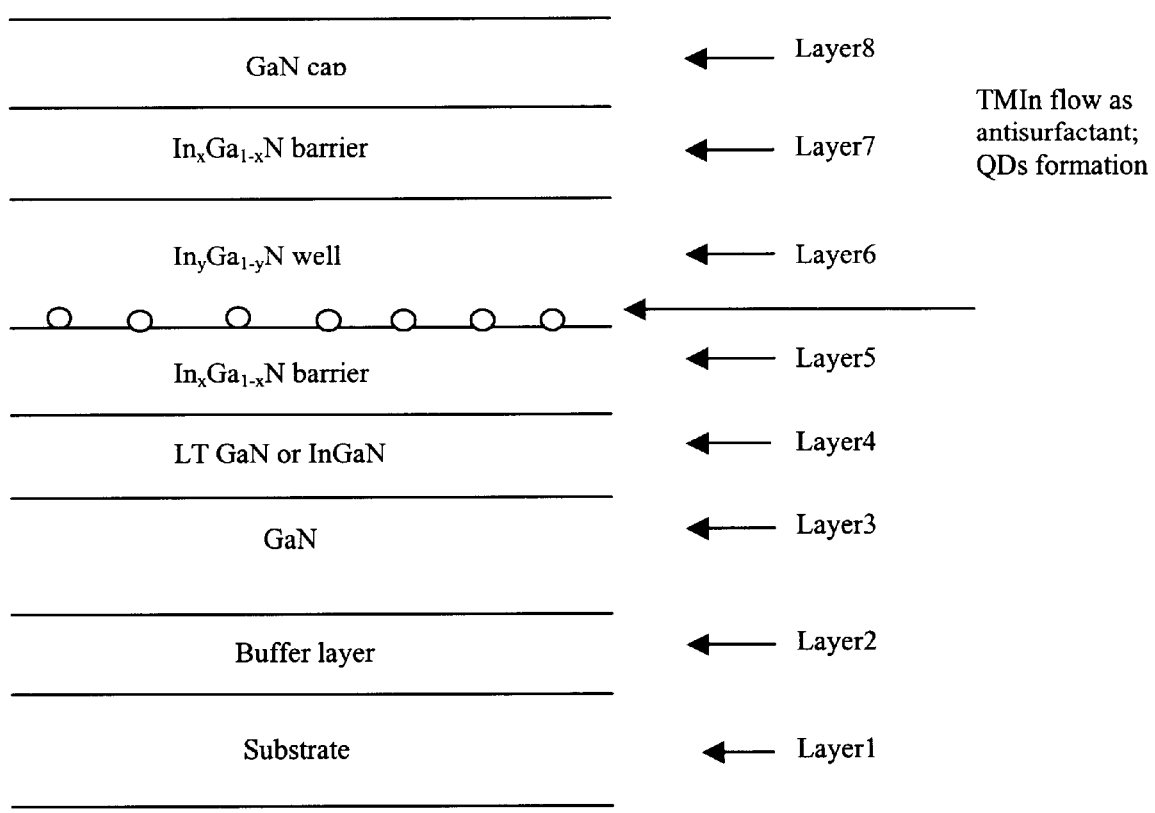
FIG. 4 illustrates the growth of SQWs in the second embodiment.

Referring now to FIG. 4, layer 1 is the substrate, which is preferably sapphire, SiC or ZnO; layer 2 is the low-temperature buffer grown at about 450° C. to 600° C.; layer 3 is the undoped GaN or Si-doped GaN, grown at around 1030° C.; layer 4 is a GaN or InGaN grown at the same temperature as the barrier and well; layer 5 is a In$_x$Ga$_{1-x}$N barrier, wherein x ranges from 0.01 to 0.1 grown at about 700° C. to 800° C.; after the growth of layer 5, TMIn and ammonia were flowed to form "seeds" for the growth of indium rich QDs;, layer 6 is the In$_y$Ga$_{1-y}$N quantum well where y is greater than x; layer 7 is another In$_x$Ga$_{1-x}$N barrier typically similar to layer 5; layer 8 is the GaN cap grown at temperatures in the range of between 800° C. and 1030° C.

Still continuing with the description of FIG. 4, layer 1 may be any material suitable for the growth of GaN, such as sapphire, SiC, ZnO, and other alternatives with thickness of about 200 μm to 500 μm. Layer 2, the low temperature buffer which is about 20 nm to 40 nm thick, can also be a multi-layered AlGaN/GaN buffer. Layer 3 can be un-doped GaN, or Si-doped GaN to a concentration $2 \times 10^{17}$ cm$^{-3}$ to $9 \times 10^{18}$ cm$^{-3}$, or Mg doped GaN to a concentration $5 \times 10^{17}$ cm$^{-3}$ to $3 \times 10^{20}$ cm$^{-3}$, and its thickness ranges from 1 μm to 4 μm. Layer 4 can be GaN, InGaN or AlGaN grown at the same temperature as the barrier and well with the thickness of about 5 nm to 30 nm; Layer 5 and 6 can be GaN instead of InGaN. Layer 8, the 10 nm to 1000 nm thick cap, can also be AlGaN.

Figure 5:
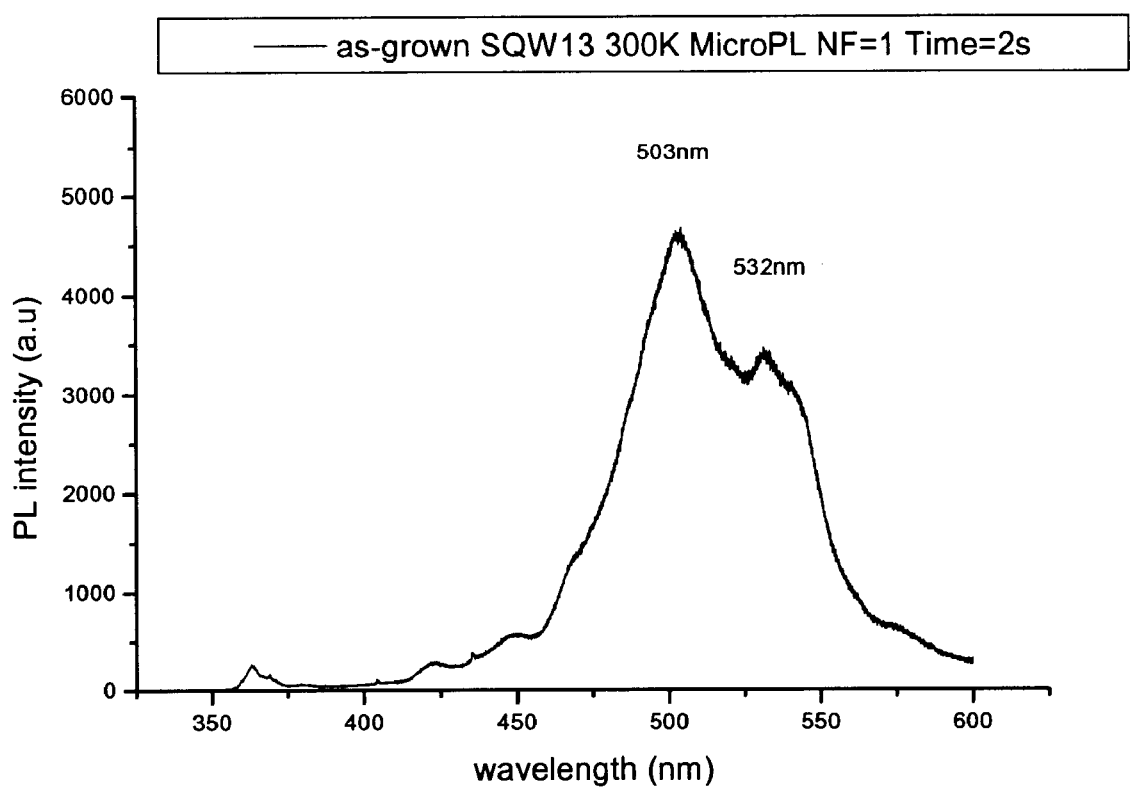
FIG. 5 is the room temperature photoluminescence from single quantum wells of the second embodiment.

FIG. 5, shows the photoluminescence of the SQW in the second embodiment at room temperature. The wavelength is 540 nm, which is in the green region. Thus, the method of the present invention can be readily used in the growth and fabrication of green LEDs.

The insertion of the layer 4 in FIG. 4 is important to extending the luminescence from 488 nm to 540 nm. Without being bound by any theory of the invention, it is thought that the low temperature GaN layer (layer 4 in FIG. 4) partially relaxes the compressive strain between the InGaN well and barrier. This relaxation of compressive strain can result in a red shift in the luminescence. Relaxation of the compressive strain can also enhance the InGaN phase separation according to Kaprov's [MRS Internet J Nitride Semicond. Res. 3, 16 (1998).] theory, in which compressive strain can suppress the InGaN phase separation.

The relatively rough surface of the low-temperature (LT) GaN layer (layer 4 in FIG. 4) could help keep the impinging indium atoms, which come from the cracking of TMIn precursor, on the surface for a longer time, thereby increasing the indium incorporation which will also result in red-shifting of the luminescence.

Various articles of the scientific periodical and/or patent literature are cited throughout this application. Each of such articles is hereby incorporated by reference in its entirety and for all purposes by such citation.

What is claimed is:

1. A method for fabricating a device that emits light in blue or green wavelengths:
   i) providing a substrate comprising a surface layer of a group III-nitride, maintaining the substrate at a temperature ranging from 700° C. to 850° C., and forming a layer of $In_xGa_{1-x}N$, wherein x ranges from 0 to 0.10, over the substrate;
   ii) maintaining the substrate at about the temperature of step i), and flowing indium-precursor at a flow rate of less than 100 μmol/min between 2 and 5 seconds, and N-precursor over the layer of $In_xGa_{1-x}N$ to form quantum dots of $In_wGa_{1-w}N$, wherein w>0.20;
   iii) maintaining the substrate at about the temperature of step i), and forming a well layer of $In_yGa_{1-y}N$, wherein y is greater than x, over the quantum dots;
   iv) maintaining the substrate at about the temperature of step i), and forming a first cap layer of $In_zGa_{1-z}N$, wherein z ranges from 0 to 0.10, over the well layer;
   v) forming a second cap layer of GaN or AlGaN over the first cap layer; thereby obtaining a device that emits light in blue or green wavelengths.

2. The method of claim 1, wherein the group III-nitride is GaN.

3. A method for fabricating a device that emits light in blue or green wavelengths comprising:
   i) providing a substrate comprising a surface layer of a group III-nitride, maintaining the substrate at a temperature ranging from 700° C. to 850° C., and forming a layer of $In_xGa_{1-x}N$, wherein x ranges from 0 to 0.1, over the substrate;
   ii) maintaining the substrate at about the temperature of step i), and forming quantum dots of $In_wGa_{1-w}N$, wherein w>0.20, on the surface by flowing over the surface a composition comprising biscyclopentadienyl magnesium, dimethyl zinc, silane or tetraethyl silane;
   iii) maintaining the substrate at about the temperature of step i), and forming a well layer of $In_yGa_{1-y}N$, wherein y is greater than x, over the quantum dots;
   iv) maintaining the substrate at about the temperature of step i), and forming a first cap layer of $In_zGa_{1-z}N$, wherein z ranges from 0 to 0.10, over the well layer;
   v) forming a second cap layer of GaN or AlGaN over the first cap layer; thereby obtaining a device that emits light in blue or green wavelengths.

4. The method of claim 3, wherein the group III-nitride is GaN.

5. The method of claim 1 or 2, wherein the forming steps are performed by metalorganic chemical vapor deposition using trimethyl indium, triethyl indium, ethyldimethyl indium or a mixture of at least two thereof as an indium precursor.

6. The method of any one of claims 1, 2 or 5, wherein trimethyl gallium, triethyl gallium, ethyldimethyl gallium or a mixture of at least two thereof is used as a gallium precursor.

7. The method of claim 6, wherein ammonia or dimethylhydrazine is used as a nitrogen precursor and hydrogen, nitrogen or a mixture thereof is used as a carrier gas.

8. The method of claim 3 or 4, wherein the forming steps are performed by metalorganic chemical vapor deposition using trimethyl indium, triethyl indium, ethyldimethyl indium or a mixture of at least two thereof as an indium precursor.

9. The method of any one of claims 3, 4 or 8, wherein trimethyl gallium, triethyl gallium, ethyldimethyl gallium or a mixture of at least two thereof is used as a gallium precursor.

10. The method of claim 9, wherein ammonia or dimethylhydrazine is used as a nitrogen precursor and hydrogen, nitrogen or a mixture thereof is used as a carrier gas.

* * * * *